United States Patent
Nakasato et al.

(10) Patent No.: US 8,283,568 B2
(45) Date of Patent: Oct. 9, 2012

(54) DEVICE MOUNTING BOARD, AND SEMICONDUCTOR MODULE AND MANUFACTURING METHOD THEREFOR

(75) Inventors: Mayumi Nakasato, Ogaki (JP); Katsumi Ito, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 645 days.

(21) Appl. No.: 12/363,983

(22) Filed: Feb. 2, 2009

(65) Prior Publication Data

US 2009/0196010 A1 Aug. 6, 2009

(30) Foreign Application Priority Data

Jan. 31, 2008 (JP) ................................ 2008-022011

(51) Int. Cl.
*H05K 1/11* (2006.01)
(52) U.S. Cl. ....................................................... 174/255
(58) Field of Classification Search .................. 174/255, 174/265
See application file for complete search history.

(56) References Cited

U.S. PATENT DOCUMENTS

| 6,316,288 | B1 | 11/2001 | Hashimoto |
| 6,831,234 | B1* | 12/2004 | Asai et al. ...................... 174/261 |
| 2005/0100720 | A1* | 5/2005 | Shirai et al. .................... 428/209 |
| 2009/0250251 | A1* | 10/2009 | Shibata et al. ................. 174/255 |

FOREIGN PATENT DOCUMENTS

| CN | 1220774 A | 6/1999 |
| JP | 2002-141629 A | 5/2002 |
| JP | 2004-193297 | 7/2004 |
| JP | 2006-310530 A | 11/2006 |
| WO | WO 2007/063954 A1 | 6/2007 |
| WO | WO 2007/109428 A2 | 9/2007 |

OTHER PUBLICATIONS

Chinese Office Action, w/ English translation thereof, issued in Chinese Patent Application No. 200910130772.6, dated Oct. 26, 2011.
Japanese Office Action, with English translation, issued in Japanese Patent Application No. 2008-022011, dated Nov. 15, 2011.

* cited by examiner

*Primary Examiner* — Chau Nguyen
(74) *Attorney, Agent, or Firm* — McDermott Will & Emery LLP

(57) ABSTRACT

A device mounting board includes: an insulating resin layer; a wiring layer provided on one main surface of the insulating resin layer; and a bump electrode, electrically connected to the wiring layer, which is protruded from the wiring layer toward the insulating resin layer. Asperities are formed on the side surface of the bump electrode and the surface roughness of the side surface of the bump electrode is greater than that of the top surface of the bump electrode.

5 Claims, 6 Drawing Sheets

DEVICE MOUNTING BOARD, AND SEMICONDUCTOR MODULE AND MANUFACTURING METHOD THEREFOR

CROSS-REFERENCE TO RELATED APPLICATIONS

This application is based upon and claims the benefit of priority from the prior Japanese Patent Application No. 2008-022011, filed on Jan. 31, 2008, the entire contents of which are incorporated herein by reference.

BACKGROUND OF THE INVENTION

1. Field of the Invention

The present invention relates to a device mounting board, and a semiconductor module and a manufacturing method therefore.

2. Description of the Related Art

In recent years, with miniaturization and higher performance in electronic devices, demand has been ever greater for further miniaturization of semiconductor devices used in the electronic devices. With such miniaturization of semiconductor devices, it is of absolute necessity that the pitch of electrodes to enable mounting on a wiring board be made narrower. A known method of surface-mounting a semiconductor device is flip-chip mounting in which solder bumps are formed on electrodes of the semiconductor device and the solder bumps are soldered to an electrode pad of the wiring board. With this flip-chip method, however, there are restrictive factors for the narrowing of the pitch of electrodes, such as the size of the solder bump itself and the bridge formation at soldering. As one structure used to overcome these limitations, known is a structure where a bump structure formed on a substrate is used as an electrode or a via, and the electrodes of the semiconductor device are connected to the bump structure by mounting the semiconductor device on a substrate with an insulating resin layer, such as epoxy resin, held between the semiconductor device and the substrate.

However, since copper and other metals which have conductivity are generally used as a material that forms the bump structure, the bump structure and the insulating resin layer have different coefficients of thermal expansion from each other. For that reason, heat stress occurs at an interface between the bump structure and the insulating resin layer as a result of a temperature change in a heat treatment or usage environment. Thus there is concern that the adhesion between the bump structure and the insulating resin layer may deteriorate. Also, there is concern that the connection reliability between the bump structure and the electrodes of the semiconductor device may deteriorate.

SUMMARY OF THE INVENTION

One embodiment of the present invention relates to a device mounting board. This device mounting board comprises: an insulating resin layer; a wiring layer provided on one main surface of the insulating resin layer; and a bump electrode, electrically connected to the wiring layer, which is protruded from the wiring layer toward the insulating resin layer, wherein asperities are formed on a side surface of the bump electrode and the surface roughness of the side surface thereof is greater than that of a top surface thereof.

It is to be noted that any arbitrary combinations or rearrangement of the aforementioned structural components and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
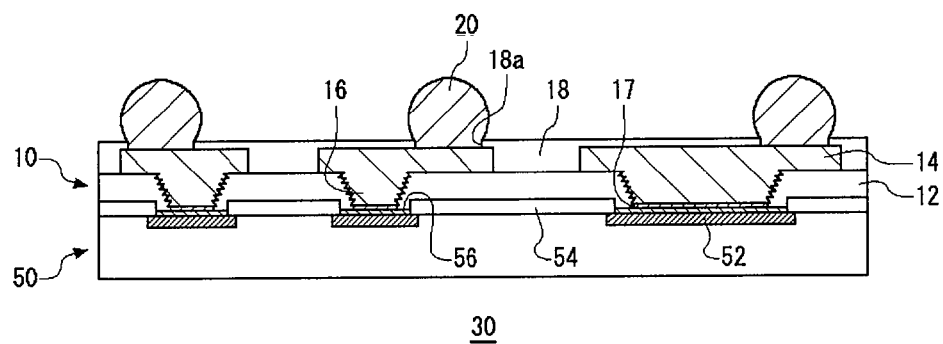
FIG. 1 is a schematic cross-sectional view showing a device mounting board according to a first embodiment of the present invention.

The invention will now be described by reference to the preferred embodiments. This does not intend to limit the scope of the present invention, but to exemplify the invention.

Hereinbelow, the embodiments will be described with reference to the accompanying drawings. Note that in all of the Figures the same reference numerals are given to the same components and the description thereof is omitted as appropriate. Moreover, the embodiments given are for illustrative purposes only and all features and their combination thereof described in the present embodiment are not necessarily essential to the invention.

First Embodiment

FIG. 1 is a schematic cross-sectional view showing a device mounting board according to a first embodiment of the present invention and a semiconductor module 30 using this device mounting board 10. The semiconductor module 30 includes a device mounting board 10 and a semiconductor device 50 mounted on the device mounting board 10.

The device mounting board 10 includes an insulating resin layer 12, a wiring layer 14 provided on one main surface of the insulating resin layer 12, and a bump electrode 16, electrically connected to the wiring layer 14, which is protruded (projected) from the wiring layer 14 toward an insulating resin layer 12 side.

The insulating resin layer 12 is made of insulating resin and is formed of, for example, a material that develops plastic flow when pressurized. An example of the material that develops plastic flow when pressurized is epoxy thermosetting resin. The epoxy thermosetting resin to be used for the insulating resin layer 12 may be, for example, one having viscosity of 1 kPa·s under the conditions of a temperature of 160° C. and a pressure of 8 MPa. If a pressure of 5 to 15 MPa is applied to this epoxy thermosetting resin at a temperature of 160° C., then the viscosity of the resin will drop to about ⅛ of the viscosity thereof with no pressurization. In contrast to this, an epoxy resin in B stage before thermosetting has no viscosity, similarly to a case when the resin is not pressurized, under a condition that the temperature is less than or equal to a glass transition temperature Tg. And the epoxy resin develops no viscosity even when pressurized under a condition that the temperature is less than or equal to the glass transition temperature Tg. Also, this epoxy thermosetting resin is a dielectric substance having a permittivity of about 3 to 4.

The wiring layer 14 is provided on one main surface of the insulating resin layer 12 and is formed of a conducive material, preferably of a rolled metal or more preferably of a rolled copper. The bump electrode 16 is provided, in a protruding manner, on the insulating resin layer 12 side. Although in the first embodiment the wiring layer 14 and the bump electrode 16 are formed integrally with each other, the structure is not particularly limited thereto. A protective layer 18 is provided on the other main surface of the wiring layer 14 opposite to the insulating resin layer 12. This protective layer 18 protects the wiring layer 14 against oxidation or the like. The protective layer 18 is formed of a photo solder resist, for instance. An opening 18a is formed in a predetermined position of the protective layer 18, and the wiring layer 14 is partially exposed through the opening 18a. A solder bump 20, which functions as an external connection electrode, is formed in a position where the opening 18a is formed. And the solder bump 20 and the wiring layer 14 are electrically connected to each other. The position in which the solder bump 20 is formed, namely, the area in which the opening 18a is formed is, for instance, a targeted position where circuit wiring is extended through a rewiring.

The planar view of the bump electrode 16 is a round shape, and the bump electrode 16 has a side surface which is shaped with a diameter smaller toward a head portion. It is to be noted here that the shape of the bump electrode 16 is not limited to any particular shape and may be, for instance, in the shape of a cylinder with a predetermined diameter. The bump electrode 16 may be polygonal, such as quadrangular, when viewed planarly. The bump electrode 16 has roughness or asperities provided on the side surface thereof. Note that the surface roughness of the side surface of the bump electrode 16 is greater than that of the top surface thereof. Here, for the roughness of the side surface, it is preferable that the ratio of a distance along the surface of roughness between two points to a linear distance between any given two points on the side surface be greater than approximately 1.22. Here, even if the ratio of the distance along the surface of roughness between two points to the linear distance between any given two points on the side surface is less than or equal to approximately 1.22 for the roughness of the side surface, such a range is still usable. However, in this case, it is less likely to achieve a desired anchor effect capable of enhancing the adhesion between the bump electrode 16 and the insulating resin layer 12. Accordingly, the roughness is preferably such that the ratio of the distances between these two points is greater than approximately 1.22.

A surface roughness Rmax of the side surface of the bump electrode 16 is approximately 1.0 μm to approximately 2.0 μm. Even if the surface roughness Rmax of the side surface thereof is smaller than approximately 1.0 μm, such a range is still usable but it is less likely to achieve a desired anchor effect capable of enhancing the adhesion between the bump electrode 16 and the insulating resin layer 12. Even if the surface roughness Rmax thereof is larger than approximately 2.0 μm, such a range is still usable but the insulating resin layer 12 cannot be filled into recesses and therefore a space may be created between the bump electrode 16 and the insulating resin layer 12. When a heat stress occurs, the space expands. As a result, the bump electrode 16 and the insulating resin layer 12 are likely to be separated from each other in a position where the space has been expanded. Hence, the surface roughness is preferably within the above range. The degree of roughness that achieves the desired anchor effect can be obtained through experiments.

The surface of the bump electrode 16 is covered with a metallic layer 17, such as a Ni/Au plating layer, formed by electrolytic plating or electroless plating, for example. It is to be noted that this metallic layer 17 may not be provided at all.

The semiconductor device 50 is mounted on the device mounting board 10 having the above-described structure so as to form the semiconductor module 30. The semiconductor module 30 according to the first embodiment is structured such that a bump electrode 16 of the device mounting board 10 is connected to a device electrode 52 of the semiconductor device 50 through the medium of the insulating resin layer 12 disposed therebetween.

The semiconductor device 50 has device electrodes 52 disposed counter to the bump electrodes 16, respectively. An element protective layer 54, in which openings are provided so that device electrodes 52 can be exposed from the openings, is stacked on one main surface of the semiconductor device 50 on the side thereof in contact with the insulating resin layer 12. A metallic layer 56, such as a Ni/Au plating layer, covers the surface of the device electrode 52. It is to be noted that this metallic layer 56 may not be provided at all. A specific example of the semiconductor device 50 is a semiconductor chip such as an integrated circuit (IC) or a large-scale integrated circuit (LSI). A specific example of the element protective layer 54 is a polyimide layer. For example, aluminum (Al) is used as the device electrode 52.

In the first embodiment, the insulating resin layer 12 is provided between the device mounting board 10 and the semiconductor device 50. The device mounting board 10 is press-bonded to one main surface of the insulating resin layer 12 whereas the semiconductor device 50 is press-bonded to the other main surface thereof. The bump electrode 16, which penetrates the insulating resin layer 12, is electrically connected to the device electrode 52 provided on the semiconductor device 50. A material that develops plastic flow when pressured is used for the insulating resin layer 12. As a result, when the device mounting board 10, the insulating resin layer 12 and the semiconductor device 50 are press-bonded in this order and united into one body, the probability that a residual film of insulating resin layer 12 will stay on at an interface between the bump electrode 16 and the device electrode 52 is suppressed. Hence, the connection reliability is improved. The surfaces of the bump electrode 16 and the device electrode 52 are covered with the metallic layer 17 and the metallic layer 56, respectively. Accordingly, the bump electrode 16 and the device electrode 52 are bonded to each other on the golds disposed on their respective outermost surfaces (Au—Au bonding), thus further improving the connection reliability between the bump electrode 16 and the device electrode 52.

(Method for Manufacturing a Device Mounting Board and a Semiconductor Module)

FIGS. 2A to 2G are cross-sectional views showing a process in a method for forming the bump electrodes 16 according to the first embodiment.

Figure 2A:
FIGS. 2A to 2G are cross-sectional views showing a process in a method for forming bump electrodes.

As shown in FIG. 2A, a copper sheet 13 is prepared as a metallic sheet having a thickness greater than at least the sum of the height of the bump electrode 16 and the thickness of the wiring layer 14. Here, the copper sheet 13 is a rolled copper.

Figure 2B:
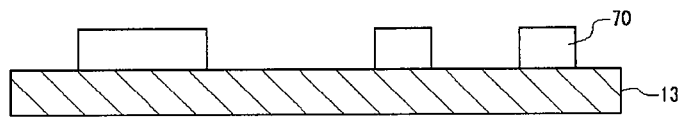

Then, as shown in FIG. 2B, resists 70 are formed selectively in alignment with a pattern of bump electrodes 16 on one main surface of the copper sheet 13 using a lithography method. More specifically, a resist film of predetermined film thickness is affixed to the copper sheet 13 by a laminator unit, and it is then subjected to exposure using a photo mask having the pattern of bump electrodes 16. After this, the resists 70 are selectively formed on the copper sheet 13 by a development. To improve the adhesion of the resists 70 to the copper sheet 13, it is desirable that a pretreatment, such as grinding, cleaning and the like, be performed as necessary on the surface of the copper sheet 13 before the lamination of the resist film thereon.

Figure 2C:
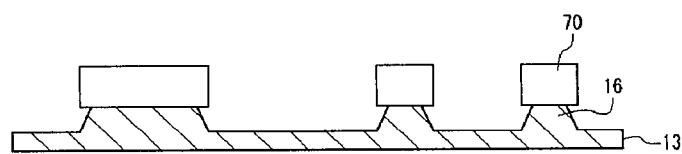

Then, as shown in FIG. 2C, the bump electrodes 16 having a predetermined pattern are formed in the copper sheet 13 using the resists 70 as a mask. More concretely, the bump electrodes 16 having a predetermined pattern are formed by etching the copper sheet 13 using the resists 70 as a mask.

Figure 2D:
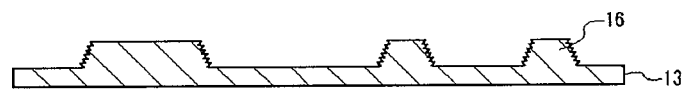

As shown in FIG. 2D, the resists 70 are removed using a stripping agent. After the removal of the resists 70 using a stripping agent, a roughening treatment is performed on the surface of the bump electrodes 16 to form asperities on the side surface thereof in such a manner that the roughness of the side surface of the bump electrode 16 is greater than that of the top surface thereof. The roughening treatment may be, for example, a chemical treatment, such as a CZ treatment (registered trademark), or a plasma treatment. In the CZ treatment, the bump electrode 16 is subjected to roughening in a manner such that the surface of the bump electrode 16 is etched by immersing the copper sheet 13 into the chemical liquid composed of the mixture of formic acid, hydrochloric acid and the like, for instance. Since the copper sheet 13 is a rolled copper in the first embodiment, the crystal grains of copper that forms the bump electrode 16 are aligned so that the major axis thereof is parallel to the top surface of the bump electrode 16 and the minor axis thereof is approximately perpendicular to the top surface of the bump electrode 16. For this reason, the asperities according the crystal grains of copper can be formed on the side surface of the bump electrode 16 by subjecting the surface of the bump electrode 16 to the roughening treatment and, at the same time, the top surface thereof can be kept flattened. When the plasma treatment is employed, the surface of the bump electrode 16 is subjected to roughening in such a manner that the copper sheet 13 is exposed to the atmosphere of a plasma gas composed of oxygen (40 sccm) and chlorine (60 sccm) for a predetermined time period, under the conditions of a high-frequency output of 600 W and a pressure of 1.5 Pa, for example, and the surface of the bump electrode 16 is etched. In the plasma treatment, the top surface of the bump electrode 16 is so covered that the top surface thereof is not subjected to roughening.

Figure 2E:
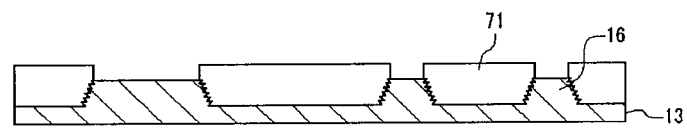

Then, as shown in FIG. 2E, resists 71 are selectively formed by a lithography method so that the top surface of the bump electrode 16 is exposed.

Figure 2F:
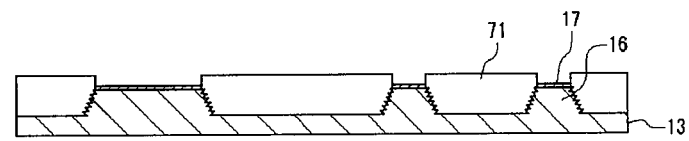

Then, as shown in FIG. 2F, a metallic layer 17, such as a Ni/Au plating layer, is formed on the top surface of the bump electrode 16 by electrolytic plating or electroless plating, for example. As described above, the top surface of the bump electrode 16 is kept approximately flattened even if the roughening treatment has been performed on the surface of the bump electrode 16, so that the approximately flattened metallic layer 17 with uniformity in thickness can be formed on the top surface thereof.

Figure 2G:
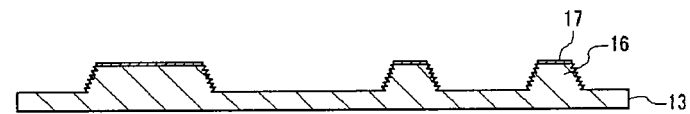

Then, as shown in FIG. 2G, the resist 71 are removed. The bump electrodes 16 are formed on the copper sheet 13 through the above-described processes. The diameters of the base, the top and height of the bump electrode 16 are 50 to 150 μmφ, 45 to 100 μmφ and 20 μmφ, respectively, for example. The thickness of Ni layer and Au layer in the metallic layer 17 is 3.0 μm and 0.5 μm, respectively, for example.

FIGS. 3A to 3F are cross-sectional views showing a process in a method for forming the wiring layer 14 and connecting bump electrodes 16 with the device electrodes 52.

Figure 3A:
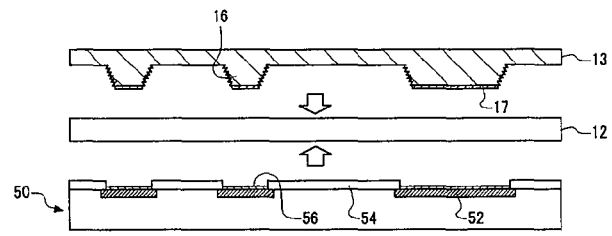
FIGS. 3A to 3F are cross-sectional views showing a process in a method for forming a wiring layer and connecting bump electrodes with device electrodes.

As shown in FIG. 3A, a copper sheet 13 is positioned on one main surface side of an insulating resin layer 12 such that the bump electrodes 16 face the insulating resin layer 12. A semiconductor device 50 provided with device electrodes 52, which are located opposite to the bump electrodes 16, is positioned on the other main surface of the insulating resin layer 12. The device electrode 52 is covered with a metallic layer 56 such as a Ni/Au plating layer. The thickness of the insulating resin layer 12 is about the height of the bump electrode 16, or approximately 20 μm. Then the copper sheet 13 and the semiconductor device 50 are press-bonded together with the insulating resin layer 12 interposed therebetween, using a press machine. The pressure and temperature to be employed in the press-forming are about 5 MPa and 180° C., respectively.

Figure 3B:
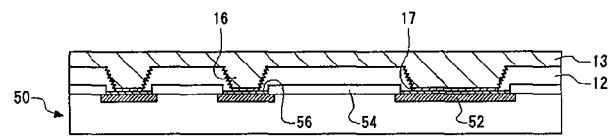

As the insulating resin layer 12 develops a plastic flow in the press-forming, the bump electrodes 16 penetrate the insulating resin layer 12. Then, as shown in FIG. 3B, the copper sheet 13, the insulating resin layer 12 and the semiconductor device 50 are integrated into a single block with the result that the bump electrodes 16 and the device electrodes 52 are press-bonded and thus electrically coupled with each other. Since the metallic layer 17 and the metallic layer 56 cover the bump electrode 16 and the device electrode 52, respectively, the bump electrode 16 and the device electrode 52 are bonded to each other on the golds disposed on their respective outermost surfaces (Au—Au bonding). The bump electrodes 16 penetrate the insulating resin layer 12 smoothly because the bump electrodes 16 are generally shaped with the diameter being smaller toward the head thereof. In the first embodiment, by press-bonding the copper sheet 13 to the insulating resin layer 12, the insulating resin layer 12 is layered on the main surface of the copper sheet 13 where the bump electrodes 16 are formed.

Figure 3C:
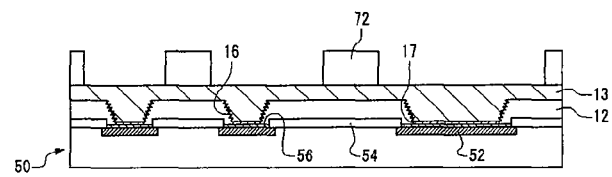

Then, as shown in FIG. 3C, resists 72 are formed selectively in alignment with a pattern of a wiring layer 14 on the main surface of the copper sheet 13, which is on the side opposite to the insulating resin layer 12, using a lithography method.

Figure 3D:
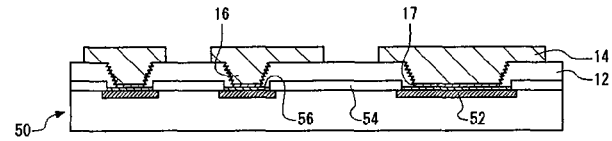

Then, as shown in FIG. 3D, the wiring layer 14 having a predetermined pattern is formed in the copper sheet 13 by etching the main surface of the copper sheet 13 using the resists 72 as a mask. After that, the resists 72 are removed. The thickness of the wiring layer 14 in the first embodiment is about 20 μm.

Figure 3E:
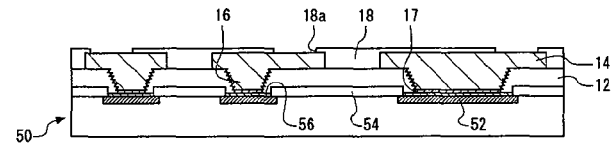

Then, as shown in FIG. 3E, a protective layer 18, which has openings 18a in regions corresponding to the positions for the formation of solder bumps 20, is formed on one main surface of the wiring layer 14, which is on the side opposite to the insulating resin layer 12, using a lithography method.

Figure 3F:
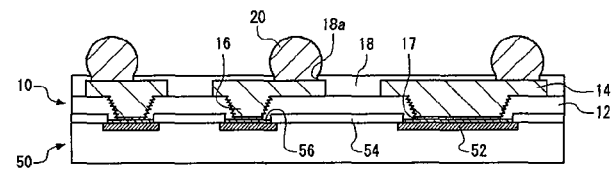

Then, as shown in FIG. 3F, the solder bumps 20 are formed within the openings 18a.

The semiconductor module 30 is formed through the above-described processes. When the semiconductor device 50 is not mounted, the device mounting board 10 is obtained.

(Evaluation of Heat Shock Test Reliability)

For a semiconductor module 30 (exemplary embodiment) formed by following the above-described procedure and a semiconductor module that does not undergo the roughening treatment performed on the bump electrodes (comparative example), a result for each of the two semiconductor modules obtained after a heat shock test complied with JIS C 0025 has been conducted is shown in Table 1. In Table 1, the degree of roughness in the exemplary embodiment and the comparative example is measured as follows. That is, for the side surface and the top surface of a bump electrode in each example, two points on an image of a sectional side view of the bump electrode taken by a scanning electron microscope (SEM) is set in such a manner that a linear distance between the two points is 5 μm in any given ten locations. Then, the distance between the two points along the surface of the bump electrode is measured. Then each values of the measured distances is divided by 5 μm so as to obtain the degree of roughness.

TABLE 1

| | Distance along surface between two points (degree of roughness) | | | |
|---|---|---|---|---|
| | Exemplary embodiment | | Comparative example | |
| | Side surface | Top surface | Side surface | Top surface |
| | 1.28 | 1.04 | 1.14 | 1.06 |
| | 2.04 | 1.12 | 1.16 | 1.04 |
| | 1.56 | 1.16 | 1.06 | 1.08 |
| | 1.26 | 1.08 | 1.08 | 1.16 |
| | 1.42 | 1.04 | 1.12 | 1.02 |
| | 1.36 | 1.06 | 1.16 | 1.06 |
| | 1.28 | 1.16 | 1.18 | 1.08 |
| | 1.44 | 1.02 | 1.10 | 1.12 |
| | 1.66 | 1.10 | 1.22 | 1.06 |
| | 1.60 | 1.06 | 1.16 | 1.14 |
| Average | 1.49 | 1.08 | 1.14 | 1.08 |

As a result of this heat shock test, a separation of the bump electrode from the insulating resin layer 12 is observed in the comparative example, whereas no separation of the bump electrode 16 from the insulating resin layer 12 is observed in the exemplary embodiment.

As described above, the roughening treatment is performed on the side surface of the bump electrode 16 in the device mounting board 10 according to the first embodiment so as to form asperities on the side surface thereof. The formation of asperities allows the surface roughness of the side surface of the bump electrode 16 to become larger than that of the top surface thereof. Accordingly, the adhesion between the bump electrode 16 and the insulating resin layer 12 is improved due to the anchor effect of the asperities. The improved adhesion between the bump electrode 16 and the insulating resin layer 12 helps prevent their separation from each other even at the occurrence of heat stress in situations where a semiconductor module 30 is manufactured or mounted on a printed wiring board or where heat stress is caused by temperature change in a usage environment and the like.

As a result, when the semiconductor device 50 is mounted on the device mounting board 10, there will be less likelihood of disconnection between the bump electrode 16 and the device electrode 52, which in turn will improve the connection reliability between the bump electrode 16 and the device electrode 52. Also, since the bump electrode 16 can be positioned reliably, the connection reliability between the bump electrode 16 and the device electrode 52 is improved. Also, since the top surface of the bump electrode 16 remains flattened even if the roughening treatment has been performed on the surface of the bump electrode 16, the deterioration of contact between the bump electrode 16 and the device electrode 52 can be prevented and therefore the connection reliability therebetween improves. Since the connection reliability between the bump electrode 16 and the device electrode 52 improves, the reliability of mounting the semiconductor 30 on the printed wiring board improves when the semiconductor module 30 is mounted on the printed wiring board.

Second Embodiment

In the above-described first embodiment, the copper sheet 13 formed of rolled copper is used as a metallic sheet. A second embodiment differs from the first embodiment in that not only the rolled metal but also an electrolytic metal can be used as the metallic sheet. A description is now given of the second embodiment. Note that the method for connecting the bump electrodes 16 to the device electrodes 52 is similar to that employed in the first embodiment. And the same components as those of the first embodiment are given the same reference numerals and the explanation thereof is omitted.

Figure 4A:
FIGS. 4A to 4E are cross-sectional views showing a process, in a method for forming bump electrodes, according to a second embodiment of the present invention.

FIGS. 4A to 4E are cross-sectional views showing a process, in a method for forming the bump electrodes 16, according to a second embodiment of the present invention;

As shown in FIG. 4A, a copper sheet 13 is prepared as a metallic sheet having a thickness greater than at least the sum of the height of the bump electrode 16 and the thickness of the wiring layer 14. Here, the copper sheet 13 is a rolled copper or electrolytic copper.

Figure 4B:
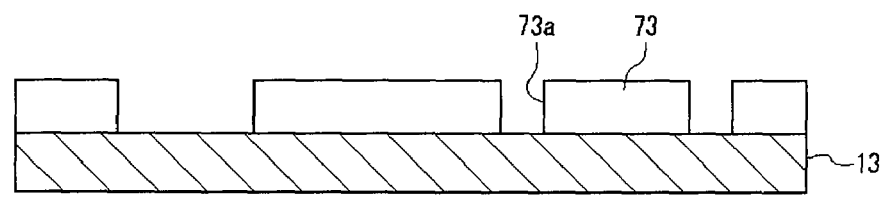

Then, as shown in FIG. 4B, resists 73 having openings 73a in preparation regions for the bump electrodes 16 are formed selectively on one main surface of the copper sheet 13 using a lithography method.

Figure 4C:
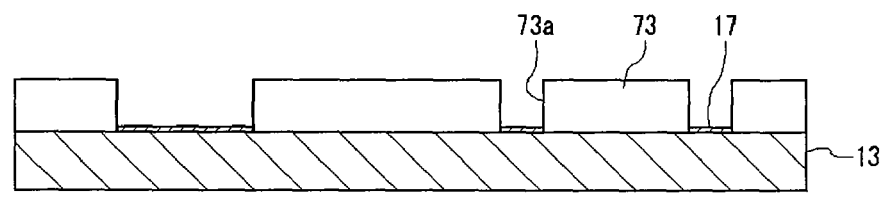

Then, as shown in FIG. 4C, a metallic layer 17, such as a Ni/Au plating layer, is formed on the surface of the copper sheet 13, exposed in the openings 73a, by electrolytic plating or electroless plating, for example. Since a roughening treatment has not yet been done, the surface of the copper sheet 13 remains approximately flattened, the approximately flattened metallic layer 17 with uniformity in thickness can be formed on the surface of the copper sheet 13.

Figure 4D:
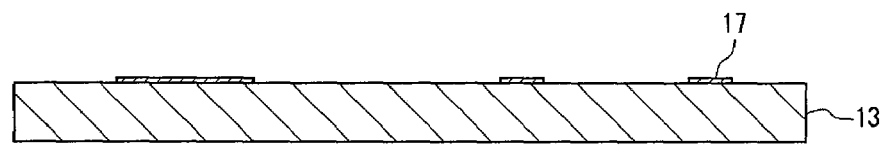

Then, as shown in FIG. 4D, the resists 73 are removed.

Figure 4E:
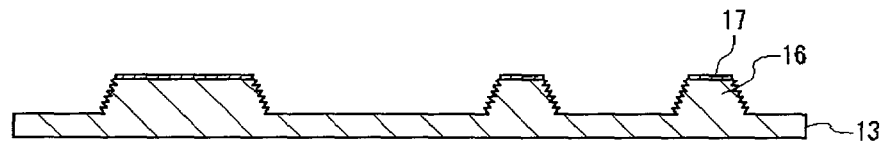

Then, as shown in FIG. 4E, the bump electrodes 16 of a predetermined pattern are formed in the copper sheet 13 using the metallic layers 17 as a mask. Then a roughening treatment is performed on the surface of the bump electrodes 16 to form asperities on the side surface thereof in such a manner that the roughness of the side surface of the bump electrode 16 is greater than that of the top surface thereof. Here, in the case where the electrolytic copper is used as the copper sheet 13, the direction of crystal grains of copper that forms the bump electrode 16 is aligned in a vertical direction to the top surface of the bump electrode 16. Thus, if the roughening treatment is performed on the surface of the bump electrode 16 before the formation of the metallic layers 17 in the same way as in the first embodiment, asperities will also be formed on the top surface thereof. As a result, flattened metallic layers 17 will not be formed and therefore the connection reliability between the bump electrode 16 and the device electrode 52 will deteriorate. In contrast, in the second embodiment the metallic layers 17 are formed before the roughening treatment and therefore the top surface of the bump electrode 16 can be kept flattened even if the copper sheet 13 is formed of electrolytic copper. Thus, the contact surface with the device electrode 52 can be kept flattened.

The bump electrodes 16 are formed on the copper sheet 13 through the above-described processes.

According to the second embodiment, the following advantageous effects are achieved in addition to the aforementioned advantages of the first embodiment. That is, in this second embodiment, the metallic layer 17 is formed on the top surface of the bump electrode 16 before the roughening treatment is performed on the surface of the bump electrode. Hence, the top surface of the bump electrode 16 can be kept flattened even if the electrolytic copper is used for the copper sheet 13. As a result, even though the electrolytic copper is used for the copper sheet 13, the adhesion between the bump electrodes 16 and the insulating resin layer 12 can be improved and, at the same time, the connection between the bump electrode 16 and the device electrode 52 can be improved. Further, since the metallic layers 17 are used as a mask in the formation of the bump electrodes 16, the number of processes required for the manufacturing of the device mounting board 10 can be reduced.

Third Embodiment

Next, a description will be given of a mobile apparatus (portable device) provided with a semiconductor module according to the above described embodiments. The mobile apparatus presented as an example herein is a mobile phone, but it may be any electronic apparatus, such as a personal digital assistant (PDA), a digital video cameras (DVC) or a digital still camera (DSC).

Figure 5:
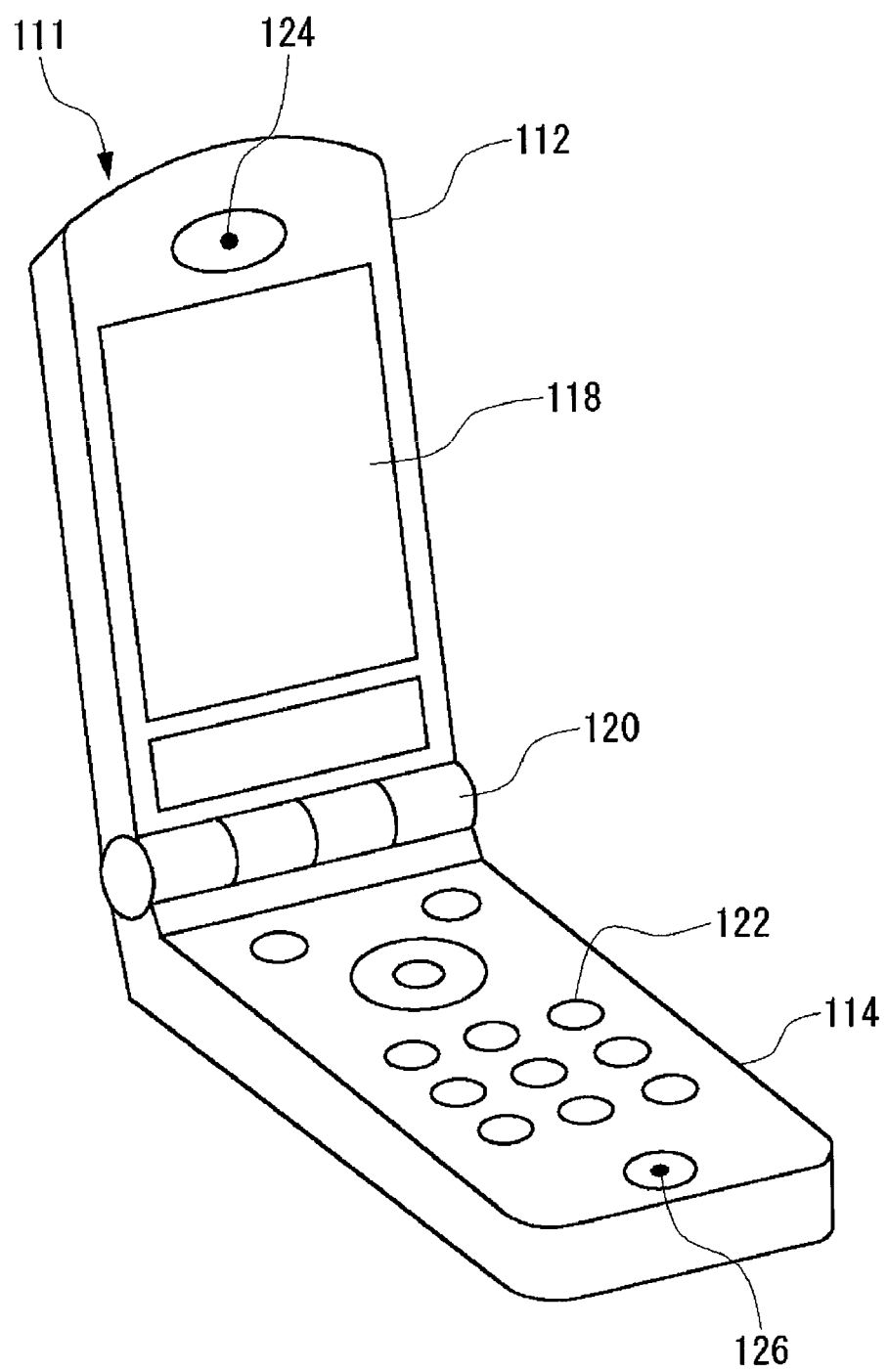
FIG. 5 illustrates a structure of a mobile phone according to a third embodiment of the present invention.

FIG. 5 illustrates a structure of a mobile phone provided with a semiconductor module 30 according to the preferred embodiments of the present invention. A mobile phone 111 has a structure of a first casing 112 and a second casing 114 jointed together by a movable part 120. The first casing 112 and the second casing 114 are turnable/rotatable around the movable part 120 as the axis. The first casing 112 is provided with a display unit 118 for displaying characters, images and other information and a speaker unit 124. The second casing 114 is provided with a control module 122 with operation buttons and a microphone 126. Note that the semiconductor module 30 according to any of the preferred embodiments of the present invention is mounted within a mobile phone 111 such as this.

Figure 6:
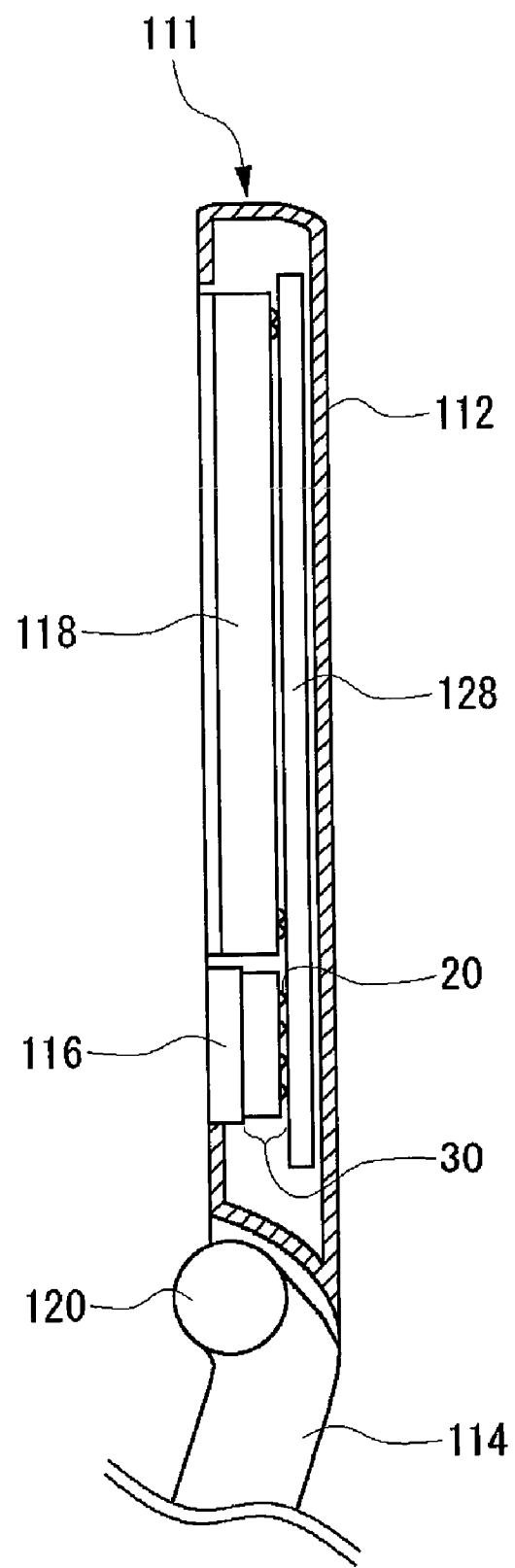
FIG. 6 is a partial cross-sectional view of a mobile phone.

FIG. 6 is a partially schematic cross-sectional view (cross-sectional view of a first casing 112) of the mobile phone shown in FIG. 5. The semiconductor module 30 according to any of the preferred embodiments of the present invention is mounted on a printed circuit board 128 via the solder bumps 20 and is coupled electrically to the display unit 118 and the like by way of the printed circuit board 128. Also, a radiating substrate 116, which may be a metallic substrate, is provided on the back side of the semiconductor module 30 (opposite side of solder bumps 20), so that the heat generated from the semiconductor module 30, for example, can be efficiently released outside the first casing 112 without getting trapped therein.

By employing the device mounting board 10 and the semiconductor module 30 according to the above-described embodiments, the reliability of mounting the semiconductor module 30 on the printed wiring board improves. Thus, the reliability as to a portable device, provided with such a semiconductor module 30, according to the present embodiment improves.

The present invention is not limited to the above-described embodiments only, and it is understood by those skilled in the art that various modifications such as changes in design may be made based on their knowledge and the embodiments added with such modifications are also within the scope of the present invention.

For example, in the above-described embodiments, the wiring layer of the device mounting board has a single layer but this should not be considered as limiting and it may be multilayered. Through the bump is formed on the outermost surface of the wiring layer, this should not be considered as limiting. For example, A MOS transistor may be bonded to the wiring layer, and the source electrode, the drain electrode and the gate electrode of the MOS transistor may be electrically connected to the wiring layer.

Also, the structure according to the present embodiments is applicable to a process for manufacturing semiconductor packages, which is a so-called wafer-level CSP (Chip Size Package) process. The semiconductor module manufactured by this wafer-level CSP process is made thinner and smaller.

While the preferred embodiments of the present invention and their modifications have been described using specific terms, such description is for illustrative purposes only, and it is to be understood that changes and variations may further be made without departing from the spirit or scope of the appended claims.

What is claimed is:

1. A device mounting board, comprising:
an insulating resin layer;
a wiring layer provided on one main surface of said insulating resin layer; and
a solid bump electrode, electrically connected to said wiring layer, which is protruded from said wiring layer toward said insulating resin layer,
wherein asperities are formed on a side surface of said bump electrode and the surface roughness of the side surface thereof is greater than that of a top surface of an end of the bump electrode in a direction of protrusion, and
a surface roughness Rmax of the side surface of said bump electrode is approximately 1.0 μm to approximately 2.0 μm.

2. A device mounting board according to claim 1, wherein the asperities are such that the ratio of a distance along a surface of roughness between two points to a linear distance between the two points on the side surface be greater than approximately 1.22.

3. A device mounting board according to claim 1, wherein said bump electrode is formed of a rolled metal.

4. A semiconductor module, comprising:
a device mounting board according to claim 1; and
a semiconductor device including a device electrode disposed counter to the bump electrode,
wherein the bump electrode penetrates the insulating resin layer, and the bump electrode and the device electrode are electrically connected to each other.

5. A device mounting board, comprising:
an insulating resin layer having a through hole;
a wiring layer on the insulating resin layer; and
a solid bump electrode extending from the wiring layer and occupying an entire space in the through hole of the insulating resin layer, wherein
the solid bump electrode has a side surface contacting a surface of the through hole, and surface roughness of the side surface is greater than that of a distal end surface of the bump electrode, and
a surface roughness Rmax of the side surface of the bump electrode is approximately 1.0 μm to approximately 2.0 μm.

* * * * *